United States Patent [19]

Laridon

[11] 3,798,034

[45] Mar. 19, 1974

[54] PROCESS FOR THE PRODUCTION OF HALF-TONE AND LINE WORK MULTI-COLOR PHOTOGRAPHIC IMAGES

[75] Inventor: Urbain Leopold Laridon, Wilrijk, Belgium

[73] Assignee: AGFA-Gevaert N.V., Mortsel, Belgium

[22] Filed: Feb. 25, 1972

[21] Appl. No.: 229,586

[30] Foreign Application Priority Data

Feb. 26, 1971 Great Britain ...................... 5563/71

[52] U.S. Cl. .......................... 96/15, 96/17, 96/35.1, 96/49

[51] Int. Cl. ........................... G03c 7/16, G03c 7/00

[58] Field of Search ............... 96/14, 15, 23, 35, 49, 96/41, 71, 48 HD, 35.1, 17

[56] References Cited

UNITED STATES PATENTS 3,671,236 6/1972 Van Beukesom ...................... 96/15

*Primary Examiner*—Norman G. Torchin
*Assistant Examiner*—Alfonso T. Suro Pico
*Attorney, Agent, or Firm*—William J. Daniel

[57] ABSTRACT

Multi-colored half-tone and line-work positive photographic images are produced from a multi-colored original. The photographic element used comprises a support carrying a light-sensitive layer spectrally sensitized to one of the three primary color regions of the visible spectrum and containing a photopolymerizable monomer and a photopolymerization initator therefor, dispersed in a polymeric binder. The images are produced by a process comprising the steps of:

A. exposing the light-sensitive layer to actinic light through the multi-colored original, B. heating and pressing together the exposed light-sensitive layer on a receptor surface and stripping away the temporary support together with the photopolymerized parts of the light-sensitive layer, so that the unpolymerized parts are transferred to the receptor surface in the form of a positive color separation image, C. exposing this color separation image to actinic light to polymerize the photopolymerizable monomer, D. repeating the above steps with two other elements comprising a temporary support carrying a light-sensitive layer spectrally sensitized to one of the two other primary color regions of the visible spectrum and also containing a photopolymerizable monomer and an initiator dispersed in a polymeric binder.

In each step (B) the exposed light-sensitive layer is heated and pressed on the receptor surface in superposition on the positive color separation image(s) already present and in register therewith.

7 Claims, No Drawings

PROCESS FOR THE PRODUCTION OF HALF-TONE AND LINE WORK MULTI-COLOR PHOTOGRAPHIC IMAGES

This invention relates to a process for producing half-tone and line-work multicolor photographic images by the formation of separation images in register on a receptor surface, and to photographic materials used therefor.

The term "register" as used herein is intended to cover the correct relative placement of two or more single color images, e.g., on a receptor, in such a way that a perfect plural or multi-color image is formed. The registering can be accomplished visually, e.g., through the use of register marks on the separation color transparencies or on such transparencies and a receptor, or by the use of prepunched transparencies that are mounted on appropriate locating pins during exposure, and during transfer of the color separation images to a receptor sheet.

The production of half-tone and line-work, plural or multi-color images is of interest in the field of design, e.g., in the production of color patterns, color wiring and circuit diagrams, cartography, color proofing, and in the production of transparencies for dia and overhead-projection. Especially in the graphic arts there is a great need for a simple and fast technique allowing the production of "color proofs" of high quality and reproducibility. Indeed, in the graphic arts it is desirable to produce color proofs to assist the color etcher in the correction of a set of color printers prior to their use in the production of color plates and also to reproduce the color quality to be attained during the printing process.

Therefore, it is an object of this invention to provide a new and practical process for the production of color proofing images.

According to the invention a process is provided for the production of a multi-colored half-tone and line-work positive photographic image from a multi-colored original, by the use of an element comprising a temporary support carrying a light-sensitive layer spectrally sensitized to one of the three primary color regions of the visible spectrum and containing a photopolymerizable monomer and a photopolymerization initiator therefor, dispersed in a polymeric binder material, said process comprising the steps of:

A. exposing the light-sensitive layer to actinic light through the multi-colored original, B. heating and pressing the exposed light-sensitive layer on a receptor surface and stripping away the temporary support together with the photopolymerized parts of the light-sensitive layer, thereby transferring to the receptor surface, the unpolymerized parts of the light-sensitive layer in the form of a positive color separation image of the original, C. exposing said positive color separation image to actinic light sufficiently to polymerize the photopolymerizable monomer thereof, D. repeating the above process steps with two other elements comprising a temporary support carrying a light-sensitive layer spectrally sensitized to one of the two other primary color regions of the visible spectrum and also containing a photopolymerizable monomer and a photopolymerization initiator therefor, dispersed in a polymeric binder material, in each step (B) the exposed light-sensitive layer being heated and pressed on the receptor surface in superposition on the positive color separation image(s) already present and in register therewith, the three positive color separation images that have been transferred to the receptor surface in register, thus forming a multi-colored positive image of the original.

Each of the three light-sensitive layers is sensitized spectrally to one of the three primary color regions of the visible spectrum. The dyes and pigments that are added for this purpose may be chosen most conveniently from photo-reducible dye-stuffs and pigments taken from the group consisting of derivatives of thiazine such as methylene blue and thionine, derivatives of xanthene such as rose bengale erythrosine and phloxine, and derivatives of acridine such as benzoflavine and flaveosine. Together with the photopolymerization initiator present they activate the photopolymerization of the monomer in the places struck by actinic light.

A very interesting photopolymerization initiator is N-phenyl-glycine. Other initiators are compounds containing a diazosulphone group such as described in our United States application Ser. No. 865,191 filed Oct. 9, 1969, wherein a very large group of compounds containing a diazosulphone group has been given. Most interesting are (phenylsulphonyl)-(p-tolyl)-diimide, (phenylsulphonyl)-(p-methoxy-phenyl)-diimide, (p-acetamidophenylsulphonyl)-(p-tolyl)-diimide, the sodium salt of (phenylsulphonyl)-(p-sulphophenyl)-diimide, (p-tolylsulphonyl)-(p-acetamidophenyl)-diimide, (p-tolylsulphonyl)-(p-benzamidophenyl)-diimide, (p-tolylsulphonyl)-(p-benzoylphenyl)-diimide, (m-carboxyphenylsulphonyl)-(p-carboxyphenyl)-diimide, and (phenylsulphonyl)-(p-nitrophenyl)-diimide.

Other very interesting photopolymerization initiators are compounds containing at least one acyldiazomethane group, such as described in our United States application Ser. No. 66,558, filed Aug. 28, 1970, now abandoned, e.g. bis(phenylsulphonyl)-diazomethane, bis(4-tolylsulphonyl)-diazomethane, bis(4-chlorophenylsulphonyl)-diazomethane, (phenylsulphonyl)-(4-methylphenylcarbonyl)-diazomethane, (phenylsulphonyl)-(4-nitrophenylcarbonyl)-diazomethane, and (phenylsulphonyl)-(4-methoxyphenylcarbonyl)-diazomethane.

In the process of the invention the light-sensitive layers comprise a photopolymerizable monomer in addition to the photo-reducible dyestuffs or pigments and the photopolymerization initiators. This monomer may be chosen from ethylenically unsaturated polymerizable compounds such as acrylamide, methacrylamide, hydroxyalkyl acrylamides and methacrylamides and polyethylene glycol monoacrylates. Preferably, however, the photopolymerizable monomers comprise more than one carbon-to-carbon double bond, e.g. two terminal vinyl groups. Examples of such compounds are e.g. divinyl-benzene, glycol diacrylates such as triethylene glycol diacrylate, and N,N'-alkylene-bis-acrylamides.

The light-sensitive layers comprise a hydrophilic or hydrophobic colloid as polymeric carrier or binder material for the light-sensitive mixture of photopolymerizable monomer, photoreducible dyestuff or pigment, and photopolymerization initiator. The choice of the polymeric binder material is dependent on its solubility in solvents which can also be used as solvents for the light-sensitive mixture. Such binding agents are for instance polystyrene, polymethyl methacrylate, polyvinyl acetate, polyvinyl butyral, partially saponified cellulose acetate and phenoxy resins derived from the polycondensation of ethylene chlorohydrin with bis(4-hydroxyphenyl)-alkanes. In some cases water-soluble polymeric binders can be used, e.g. gelatin, starch, carboxymethyl cellulose and polyvinyl alcohol. It is evident that the ratio of light-sensitive mixture to binder material also influences the photopolymerization. The higher this ratio, the higher the photopolymerization rate of a particular light-sensitive layer.

A light-sensitive element is made by applying solutions of a polymeric binder material and of photopolymerizable mixtures of a photoreducible dyestuff, a photopolymerizable monomer, and a photopolymerization initiator as a layer on a temporary support. The photopolymerizable coating composition may also comprise stabilizers, plasticizers, extenders, and minor amounts of additives that increase the light-sensitivity of the composition.

The light-sensitive coating composition formed is applied to the temporary support by spray, brush, roller, doctor blade, air brush, or wiping techniques, in order to leave thereon after evaporation of the solvent or solvent mixture a coating having a thickness of 0.5 to 20 micron, preferably of 1 to 10 micron. As temporary supports are used relatively hydrophobic, flexible supports such as unsubbed cellulose triacetate sheets, polystyrene sheets, sheets of co(vinyl acetate/vinyl chloride), or unsubbed polyethylene terephthalate sheets. According to a preferred embodiment of the invention the light-sensitive layer is composed in such a way that its adherence to the temporary support is very weak. This can be attained by the addition of hygroscopic agents, e.g. a water-soluble organic hygroscopic compound, such as glycerol, or by the use of wetting agents and plasticizing agents.

The light-sensitive coating is then ready for exposure to actinic light rays. Suitable light-sources include carbon arcs, xenon lamps, mercury vapour lamps, fluorescent lamps, argon glow lamps, photographic flood lamps, and tungsten lamps. Some moderate heating of the light-sensitive layer will greatly increase the photopolymerization speed.

For the reproduction of a multi-colored original, each of the three spectrally sensitized light-sensitive elements is exposed through the original. When this original is not transparent, a positive photographic color transparency of the original is to be made by known techniques. Since the three positive color separation images formed in the three spectrally sensitized light-sensitive elements are directly prepared from the same transparent multi-colored original, it is no longer necessary to prepare three different color separation positives before exposure of the different elements.

The portions of the photopolymerizable layers exposed to actinic light become insoluble in the solvent or solvent mixtures wherein the unexposed photopolymerization composition is soluble. Since some of the photopolymerization compositions can be somewhat tacky it might be necessary during the exposure to actinic light to protect the light-sensitive layer with a transparent covering film, such as a thin unsubbed film of polyethylene terephthalate. After exposure and before transfer to the receptor surface this transparent film is stripped from the light-sensitive surface.

The receptor surface may be rigid or flexible and should have a good adherence to the transferable unpolymerized photopolymerizable coating when the exposed light-sensitive element is pressed against it and heated meanwhile. In general a heating at 100°–125°C is sufficient. As a result of this heating the unpolymerized portions of the photopolymerizable layer stick to the receptor surface. When the temporary support is then pulled away, the polymerized portions of the photosensitive layer corresponding with the places struck by the light rays, remain attached to the temporary support, leaving on the receptor surface a color separation positive of the multi-colored original.

Depending on the use of the multicolor print the receptor support is transparent or opaque. So, it is possible to use metal layers or sheets, glass, ceramics, resin supports, and paper, e.g. paper provided with a baryta layer.

Resin supports having a high mechanical strength, a very low water-absorption, and consequently a high dimensional stability in dry and wet state can be made of a linear polyester e.g. polyethylene terephthalate. Good results as to the dimensional stability are attained with aluminium sheets sandwiched between two high wet-strength paper sheets, although this material is rather expensive.

Receptor resin supports can be made opaque by coating them with a matted subbing layer or by matting or coloring them in the mass. The matting can be effected by pigments known in the art, e.g., titanium dioxide, zinc oxide, and barium sulphate.

After having transferred to the receptor surface the color separation positive obtained by the different steps of the process of the invention, using a light-sensitive element spectrally sensitized to one of the three primary color regions of the visible spectrum, the composition of the image material upon the receptor is still photopolymerizable and in some cases it remains tacky. This can be remedied by exposing the whole surface of the color separation image to actinic light, whereby the light-sensitive layer is photopolymerized.

The different process steps described above for a light-sensitive element spectrally sensitized to one of the three primary colors of the visible spectrum are repeated with a light-sensitive element sensitized to a second one of the three primary colors and thereafter with a light-sensitive element sensitized to the third of the three primary colors, care being taken that the two elements are pressed and heated on the already present color separation positive image in register therewith as defined hereinbefore.

The order in which the three different light-sensitive elements are transferred after exposure to the receptor is arbitrary. Preference, however, is given to a procedure wherein first the layer sensitive to red (cyan colored), secondly the layer sensitive to blue (yellow colored), and finally the layer sensitive to green (magenta colored) are transferred to the receptor.

It has been observed that some of the photoreducible dyes and pigments produce an overlapping of the absorption in two of the spectral regions. For instance when using benzoflavine as photoreducible dye for the layer sensitive to blue (maximum absorption at 467 nm) and rose bengale for the layer sensitive to green (maximum absorption at 575 nm), an overlapping of the absorption at both sides of 500 nm is found. This can be remedied by making use of filter materials such as a magenta filter for the layer sensitized to blue and a yellow filter for the layer sensitized to green.

EXAMPLE 1

A. Composition of the Photopolymerizable Layers

1. Blue Sensitized Element (Yellow Colored)

Low viscosity polyvinyl butyral (containing 20 mole percent of vinyl alcohol units) was dissolved in a concentration of 10 percent by weight in a 80:20 by volume mixture of acetone and ethylene glycol monomethyl ether. To 100 ml of this solution were added while stirring:

| | |
|---|---|
| N-phenyl-glycine | 0.3 g |
| benzoflavine | 0.3 g |
| triethylene glycol diacrylate | 6 ml |

The benzoflavine (color index 46,005) had a maximum absorption at 467 nm in a 50:50 by volume mixture of ethylene glycol monomethyl ether and water. It gave a yellow color to the composition and corresponded to the following formula:

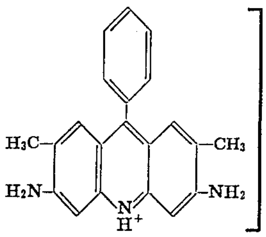

The solution formed was coated on an unsubbed polyethylene terephthalate film in such a way that upon drying a light-sensitive layer of ±5 micron was formed. A protective film of polyethylene terephthalate having a thickness of 0.05 to 0.07 mm was laid upon the photopolymerizable layer.

2. Green Sensitive Element (Magenta Colored)

To 100 ml of the polyvinyl butyral solution described under (1) were added while stirring:

| | |
|---|---|
| N-phenyl-glycine | 0.3 g |
| rose bengale | 0.6 g |
| triethylene glycol diacrylate | 6 ml |

The rose bengale (color index 45,440) had a maximum absorption at 575 nm in acetone and colored the composition magenta. It corresponded to the following formula:

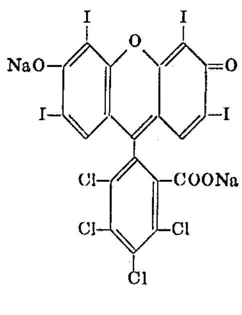

The solution was coated on an unsubbed polyethylene terephthalate film as described under (1) in such a way that upon drying a layer of approximately 10 micron was formed. A thin protective film of polyethylene terephthalate was also laid upon the photopolymerizable layer.

3. Red Sensitive Element (Cyan Colored)

To 100 ml of the polyvinyl butyral solution described under (1) were added while stirring:

| | |
|---|---|
| (phenylsulphonyl)-(p-nitrophenyl)-diimide | 0.2 g |
| methylene blue | 0.2 g |
| triethylene glycol diacrylate | 6 ml |

The methylene blue (color index 52,015) had a maximum absorption at 653 nm in a 50:50 by volume mixture of ethylene glycol monomethyl ether and water, and it colored the composition cyan. It corresponded to the following formula:

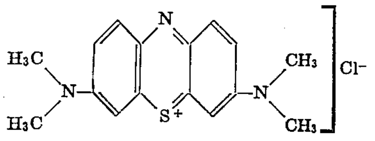

The solution formed was coated on an unsubbed film of polyethylene terephthalate in such a way that a layer of approximately 10 micron was formed. A thin protective film of polyethylene terephthalate was laid upon the photopolymerizable layer.

B. Exposure of the Photopolymerizable Layers

The three photopolymerizable layers covered with the protective films were exposed in contact with the transparent multicolor original in a vacuum frame at a distance of 15 cm from a 300 Watt tungsten lamp. The vacuum frame was heated at 60°–70°C with an infrared lamp to increase the photopolymerization rate. For the blue-sensitized element the exposure lasted 1 minute, for the green-sensitized element 30 seconds to 1 minute and for the red-sensitized element 1½ minute. If a 75 Watt tungsten lamp was used without heating of the vacuum frame these periods varied between 5 and 10 minutes.

Since the absorption region of benzoflavine extends beyond 500 nm a magenta filter was placed during exposure between the original and the blue-sensitized element. This magenta filter was made as follows. A thin polyethylene terephthalate film was coated with 10 ml of a polyvinyl butyral solution (see A1) in which there had been dissolved 0.01 g of erythrosine (color index 45,430) corresponding to the following formula:

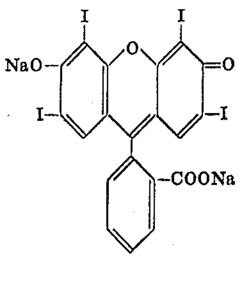

Thickness of the filter layer upon drying: approximately 20 micron.

Since in the case of rose bengale absorption already starts at 450 nm, a yellow filter layer was placed during exposure between the multi-colored original and the green-sensitized element. This yellow filter layer was formed in the same manner as described for the magenta filter, with the difference, however, that the 0.01 g of erythrosine was replaced by 0.05 g of flaveosine (color index 46,000) corresponding to the following formula:

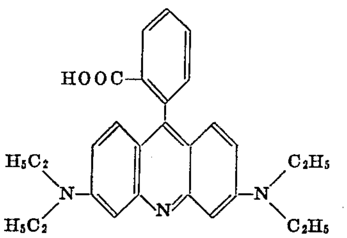

C. Transfer to Receptor Surface

As receptor surface a paper was used the surface of which had been provided with a known baryta layer. The protective film was pulled away from the three elements. First the red-sensitive element (cyan colored) was pressed against the baryta layer of the paper receptor and heated at 100°–120°C, whereafter the temporary support was stripped off. The photopolymerized parts of the photopolymerizable layer remained attached to the temporary support, whereas the still unpolymerized parts of the layer adhered to the receptor surface and formed there a cyan separation positive image of the original.

This image was exposed to the same light source in order to completely polymerize what remained on the receptor of the polymerizable layer.

Subsequently, the exposed blue-sensitized element (yellow colored) was pressed in register on the already present cyan separation image and heated at 100°–120°C. The temporary support with the polymerized parts of the blue sensitized layer was stripped off. The unpolymerized parts forming the yellow separation positive image remained on top of the cyan separation positive image and were polymerized by exposure to the same light source.

The same procedure was repeated with the exposed green-sensitized element (magenta colored) so that finally on the receptor surface successively a cyan, a yellow, and a magenta separation positive image were applied in register, thus forming a multi-colored image of the multi-colored original. This image was an exact positive reproduction of the original.

EXAMPLE 2

A. Composition of the Photopolymerizable Layers

1. Blue-sensitised Element (Yellow Colored)

Low viscosity polyvinyl butyral (containing 20 mole percent of vinyl alcohol units) was dissolved at a concentration of 10 percent by weight in a 80:20 by volume mixture of acetone and ethylene glycol monomethyl ether. To 30 ml of the solution thus formed were added while stirring:

| | |
|---|---|
| N-phenyl-glycine | 0.09 g |
| benzoflavine (see example 1A1) | 0.09 g |
| triethylene glycol diacrylate | 1.8 ml |

The solution formed was applied to an unsubbed polyethylene terephthalate film of 0.1 mm in such a way that upon drying for 15 minutes at 60°–70°C a layer of 5 micron was formed. The photopolymerizable layer was covered with a thin film of polyethylene terephthalate.

Instead of 0.09 g of benzoflavine, a mixture of 0.03 g of benzoflavine and of 0.25 g of yellow pigment 16 (Color Index 20,040) (Permanent Gelb NGG Colanyl Teig — trade name of Farbwerke Hoechst AG, Germany) could be used.

2. Green-sensitized Element (Magenta Colored)

To 30 ml of the same polyvinyl butyral solution of (1) were added while stirring:

| | |
|---|---|
| N-phenyl-glycine | 0.06 g |
| rose bengale (see example 1 A2) | 0.03 g |
| pigment dispersion Permanent Carmin FBB Colanyl Teig (color index 11,000) of Farbwerke Hoechst AG, Germany | 0.25 g |
| triethylene glycol diacrylate | 1.5 ml |

The coating composition formed was applied to an unsubbed polyethylene terephthalate film of 0.1 mm in such a way that upon drying a layer of approximately 10 micron was formed. The photopolymerizable layer was covered with a thin polyethylene terephthalate film.

3. Red-sensitized Element (Cyan Colored)

To 30 ml of the same polyvinyl butyral solution of (1) were added while stirring:

| | |
|---|---|
| (phenylsulphonyl)-(p-nitrophenyl)-diimide | 0.06 g |
| methylene blue (see example 1A3) | 0.03 g |
| Heliogenblau B Colanyl Teig (Color Index 74,160) a cyan pigment dispersion of Badische Anilin- und Soda-Fabrik AG, Lubwigshafen a/Rh Germany | 0.25 g |
| triethylene glycol diacrylate | 1.2 ml |

The coating composition formed was applied to an unsubbed polyethylene terephthalate film of 0.1 mm in such a way that upon drying at 60°–70°C a layer of approximately 10 micron was formed. The photopolymerizable layer was covered with a thin polyethylene terephthalate film.

B. Exposure of the Photopolymerizable Layers

The exposure of the photopolymerizable layer covered with the protective film was performed in contact with the transparent multi-colored original as described in Example 1B, whereafter the protective films were stripped off.

C. Transfer to Receptor Surface

Following the procedure as described in Example 1C the exposed layers one after the other were pressed and heated to 100°–125°C in the order indicated and in register on a paper coated with a baryta layer, and each time the temporary supports with the polymerized portions of the polymerizable layers were stripped off, thus leaving the unpolymerized portions attached to the receptor. After each transfer the layer was exposed to actinic light to thoroughly polymerize it.

After the three transfers and exposures as indicated in Example 1C, an exact positive reproduction of the multi-colored original was obtained.

We claim:

1. Process for the production of multicolored half-tone and line-work positive photographic images from multicolored originals, by the use of an element comprising a temporary support carrying a light-sensitive colored photopolymerizable layer spectrally sensitized to one of the three primary color regions of the visible spectrum and containing a photopolymerizable monomer and a photopolymerization initiator therefor, dispersed in a polymeric binder material, said process comprising the steps of:

A. exposing the photopolymerizable layer to actinic light through the multicolored original, B. heating and pressing the exposed layer onto a receptor surface and stripping away the temporary support together with the photopolymerized parts of the layer, thereby transferring to the receptor surface the unpolymerized parts thereof in the form of a positive color separation image, C. exposing said positive color separation image to actinic light sufficiently to polymerize the photopolymerizable monomer thereof, D. repeating the above steps with two other elements each comprising a temporary support carrying a light-differently colored sensitive photopolymerizable layer spectrally sensitized to a different primary color region of the visible spectrum and containing a photopolymerizable monomer and a photopolymerization initiator therefor dispersed in a polymeric binder material, in each step (B) the exposed photopolymerizable layer being heated and pressed into the receptor surface in superposition on any positive color separation images already present and in register therewith, the three positive color separation images so transferred to the receptor surface thus forming a multicolored positive image of the original.

2. The process according to claim 1 wherein the three elements are respectively blue-sensitized by benzoflavine, green-sensitized by rose bengale and red-sensitized by methylene blue.

3. The process according to claim 1 wherein said photopolymerizable monomer is triethylene glycol diacrylate.

4. The process according to claim 1 wherein said polymeric binder material is polyvinyl butyral.

5. The process according to claim 1 wherein said initiator is a compound containing a diazosulfone group, a compound containing an acyldiazomethane group, or N-phenyl-glycine.

6. The process according to claim 1 wherein each such photopolymerizable layer is spectrally sensitized by a colored sensitizing agent imparting color to said layer.

7. The process according to claim 6 wherein the color of each such sensitizing agent is complementary to the color of the spectral region to which the layer containing said agent is sensitive.

* * * * *

UNITED STATES PATENT OFFICE

CERTIFICATE OF CORRECTION

Patent No. 3,798,034 Dated March 19, 1974

Inventor(s) Urbain L. LARIDON

It is certified that error appears in the above-identified patent and that said Letters Patent are hereby corrected as shown below:

Column 5, line 21, change "color index 46,005" to -- color index 46,065 --.

Column 7, line 10, change "color index 46,000" to -- color index 46,060 --.

Column 9, Claim 1, line 31, change "light-differently colored sensitive" to -- differently colored light-sensitive --.

Signed and sealed this 13th day of August 1974.

(SEAL)
Attest:

McCOY M. GIBSON, JR.
Attesting Officer

C. MARSHALL DANN
Commissioner of Patents

FORM PO-1050 (10-69)